United States Patent
Heid

(10) Patent No.: US 6,236,204 B1
(45) Date of Patent: May 22, 2001

(54) METHOD FOR THE OPERATION OF A MAGNETIC RESONANCE TOMOGRAPHY DEVICE

(75) Inventor: Oliver Heid, Gunzenhausen (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/520,398

(22) Filed: Mar. 8, 2000

(30) Foreign Application Priority Data

Mar. 8, 1999 (DE) .............................. 199 10 018

(51) Int. Cl.[7] ...................................................... G01V 3/00
(52) U.S. Cl. ............................................. 324/309; 324/307
(58) Field of Search .................................... 324/300, 306, 324/307, 312, 314, 318, 322

(56) References Cited

U.S. PATENT DOCUMENTS

| 4,680,545 | 7/1987 | Gray et al. . | |
| 5,250,902 | * 10/1993 | Williams et al. | 324/320 |
| 5,384,537 | * 1/1995 | Ito et al. | 324/318 |
| 5,617,026 | 4/1997 | Yoshino et al. . | |
| 5,764,059 | * 6/1998 | Mansfield et al. | 324/318 |

FOREIGN PATENT DOCUMENTS

| 197 27 657 | 1/1999 | (DE) . |
| 0 431 216 | 6/1991 | (EP) . |
| 0 597 528 | 5/1994 | (EP) . |

* cited by examiner

Primary Examiner—Louis Arana
(74) Attorney, Agent, or Firm—Schiff Hardin & Waite

(57) ABSTRACT

In a method for the operation of a magnetic resonance tomography device, the gradient pulse sequences for noise reduction are configured so that portions of a gradient pulse sequence actively damp noise-producing resonances of the gradient coil system excited by other portions of the pulse sequence of the pulse sequence. This is accomplished by interrupting the gradient pulse sequences for specific time intervals, or by configuring successive portions of a gradient pulse sequence to exhibit symmetry relative to the time axis or by inserting additional gradient pulses into the gradient pulse sequence.

4 Claims, 1 Drawing Sheet

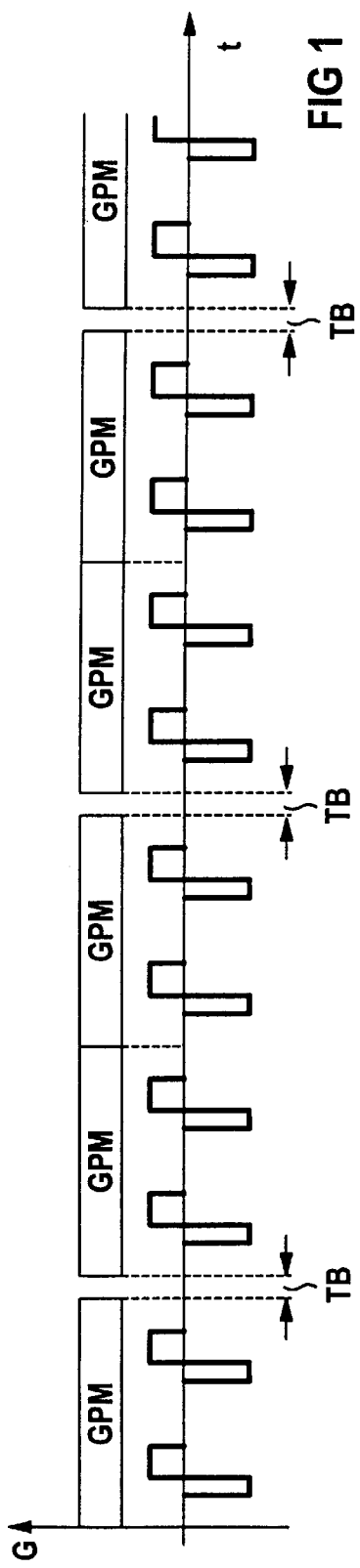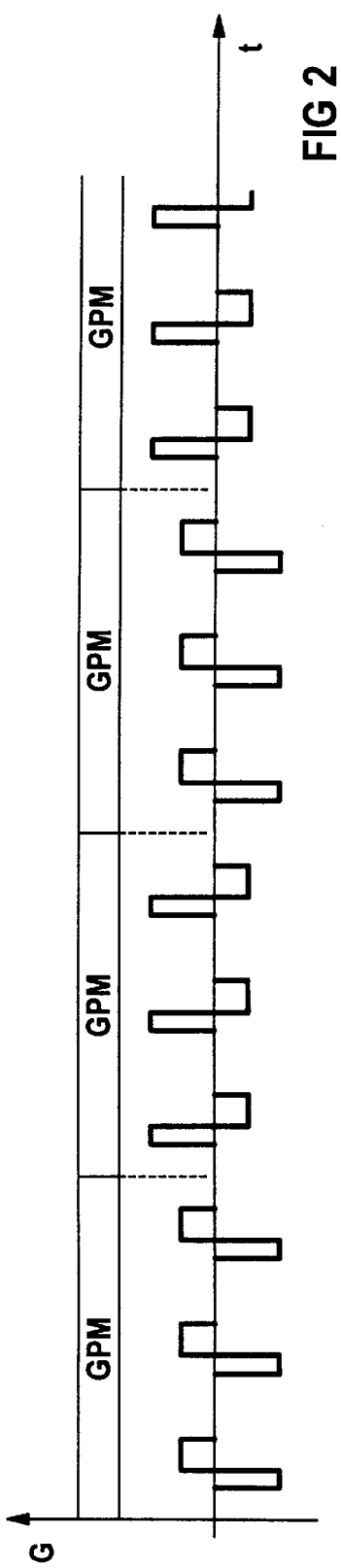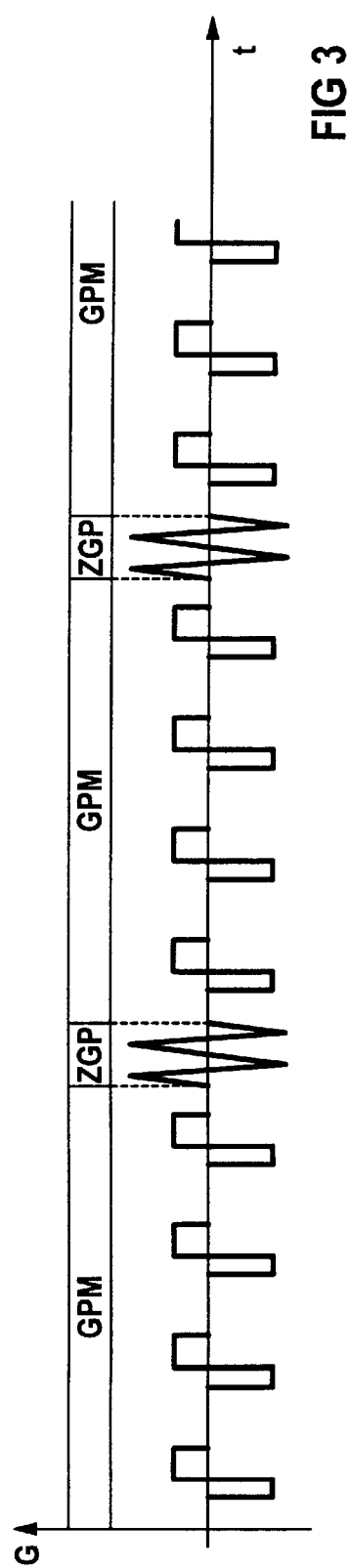

METHOD FOR THE OPERATION OF A MAGNETIC RESONANCE TOMOGRAPHY DEVICE

BACKGROUND OF THE INVENTION

1. Field of the Invention

The present invention is directed to a method for the operation of a magnetic resonance tomography device, that contains a basic field magnet, a gradient coil system and a control system, that among other things, controls the currents in the gradient coils on the basis of gradient pulses in a pulse sequence, wherein significant noise occurs due to the exciting of resonant oscillations of the gradient coil system.

2. Description of the Prior Art

Magnetic resonance tomography is a known modality for the acquisition of images of the interior of the body of the living patient. In magnetic resonance tomography devices, dynamic magnetic fields with linear gradients in all three spatial directions are superimposed on the static basic magnetic field. In this situation the time-variable currents in the gradient coils achieve amplitude values of up to several 100 A and the current flowing therein executes frequent and rapid changes in direction, with increase and decrease rates of several 100 kA/s. These currents interact with the strong basic magnetic field, of an order of magnitude of 1 Tesla, an produce significant Lorentz forces, that lead to oscillations of the gradient coil system and thereby generate noise.

A trend in magnetic resonance tomography is toward shortening of measurement times and improvement of imaging properties, achieved with increasingly faster pulse sequences. These require enhanced gradient coil performance. Higher gradient coil currents lead to higher Lorentz forces and thereby to an increase in noise. Efforts to reduce noise led to a change in the mechanical design of the magnetic resonance tomography device. For example, the rigidity of the gradient coil system has been increased, the gradient coils have been acoustically damages or isolated, and the fastening points of the gradient coil system have been placed at oscillation nodes. The faster pulse sequences control more frequent and rapid changes in the gradient coil currents, i.e. the dominant components of these currents in the frequency spectrum shift to higher frequencies. Although, for example, a doubling of the rigidity of the gradient coil system increases the resonant frequencies only by a factor of approximately 1.4, the probability increases that the fast pulse sequences will excite the resonances of the gradient coil system in spite of increased rigidity. This then leads to significant noise.

SUMMARY OF THE INVENTION

In addition to the previously described, purely mechanical design measures, an object of the invention is to reduce the noise that arises in the implementation of a pulse sequence.

The object is inventively achieved in a method for operating a magnetic resonance tomography device wherein portions of a gradient pulse sequence actively damp noise-producing resonances of the gradient coil system excited by other portions of the sequence.

A particular advantage of this active damping is that this type of noise reduction without mechanical design measures is effective for any fast pulse sequences. It is particularly advantageous to apply the active damping to pulse sequences where the form of its gradient pulse sequences, for example, for obtaining a desired imaging property, cannot be configured such that the resonances are not excited or are only weakly excited from the onset.

The noise behavior of a gradient coil system is advantageously described per gradient coil by means of a transfer function, that results from the gradient coil current as an input quantity and from the noise as an output quantity. In the case of magnetic resonance tomography devices with cylindrical patient opening, for example, the gradient coils are usually a component of the tube-like arrangement, referred to as the gradient tube. The transfer functions of the gradient tubes exhibit noticeable resonances. The dominant resonance (mode) of a gradient tube lies typically in the range of 750 Hz, has a resonant width of few Hz and slight damping. During the implementation of a gradient pulse sequence, if the spectrum thereof has a component at the same frequency as the dominant resonant frequency, an especially loud noise occurs.

Even in the event that a pulse sequence excites no resonances of a gradient coil system, a base noise level still occurs, but this is a multiple lower than if resonances are excited. The goal of the active damping is to limit the noise to a specific base noise level. The excitation of a resonant mode is a time dependent process; i.e. there is a specific excitation time, or a number of gradient pulses necessary in order to stimulate the resonance so that the maximum noise occurs. Due to this fact, it suffices to employ measures to counter an excited resonant mode in relatively long time intervals of approximately 10 to 100 ms after excitation begins. Determining the number of gradient pulses after which the active measures are to be implemented depends on the selected limit value for the maximum allowable noise.

In an embodiment, a gradient pulse sequence is interrupted after the completion of a specific pattern of gradient pulses and before this pattern is repeated for odd-numbered, positive multiples of half of the reciprocal value of the excited dominant resonant frequency of the gradient coil system. The aforementioned interruption is a variation of a pulse sequence that is very simple and surveyable in terms of its imaging properties and causes no additional electrical load on the gradient coil.

In an embodiment a gradient pulse sequence is continued with the pattern mirrored on the time axis after completion of a specific pattern of gradient pulses. The aforementioned configuration of a gradient pulse sequence causes no lengthening of the measurement time and represents no electrical additional load for the gradient coil.

In a further embodiment, additional gradient pulses that counteract the excited noise-producing resonant modes of the gradient coil system are inserted in a gradient pulse sequence after the completion of a set pattern of gradient pulses. Given a corresponding form, height and duration, a quick damping with shorter time constants than those associated with the excitation of the resonant modes is achieved with the aforementioned additional gradient pulses.

DESCRIPTION OF THE DRAWINGS

FIG. 1 is a diagram of a gradient pulse sequence with interruptions in accordance with the invention.

FIG. 2 is a diagram of a gradient pulse sequence, the gradient pulse pattern of which is mirrored on the time axis, after the completion of a gradient pulse pattern in accordance with the invention.

FIG. 3 is a diagram of a gradient pulse sequence, where additional gradient pulses are inserted into the time execution thereof.

DESCRIPTION OF THE PREFERRED EMBODIMENTS

FIG. 1 shows an exemplary embodiment of a gradient pulse sequence G, in which course current-less interruptions TB are inserted. The gradient pulse sequence shows, for example, the readout gradient of a pulse sequence. The gradient pulse pattern GPM includes, for example, a high amplitude negative pulse of short duration and a low amplitude positive pulse of longer duration as well as a repetition of the aforementioned pulses. The interruptions TB occur, for example, shown after the first, third and fifth gradient pulse patterns. They are half as long as the reciprocal of the dominant resonant frequency of the gradient coil system. The pulses of the first gradient pulse pattern excite the dominant resonant mode of the gradient coil system. After the implementation of the first gradient pulse pattern, the resonant excitation is still far from reaching its maximum. The noise is accordingly slight. The first interruption causes the second gradient pulse pattern to act exactly opposite to the first gradient pulse pattern and so that the excited resonance is damped. The third gradient pulse pattern again results in an excitation of the resonant mode. The second interruption in turn causes is that the fourth gradient pulse pattern to oppose the resulting excitation, etc. An alternative excitation and damping of the resonant oscillations thus takes place.

At no time does the resonant oscillation reach its maximum. The noise remains correspondingly slight. The resulting noise is lower, the shorter the time intervals are between the interruptions, equivalent to a short gradient pulse pattern, but the measurement time is longer.

In another embodiment the interruptions are introduced after each gradient pulse pattern or the same number of gradient pulse patterns does not always occur between the interruptions of a gradient pulse sequence. The length of the interruptions is not always half of the reciprocal value of the dominant resonant frequency, but rather an odd-numbered, positive multiple of this value. These other embodiments are, for example, to accommodate requirements of magnetic resonance imaging in different contexts.

FIG. 2 shows the diagram of a gradient pulse sequence G, wherein the successive gradient pulse patterns GPM are configured such that the subsequent gradient pulse pattern, in comparison to the preceding gradient pulse pattern, is mirrored on the time axis. The time axis proceeds through the zero point of the gradient axis, i.e. through the point at which the controlled gradient field intensity is equal to zero. By this mirroring, the same effect is achieved as with the interruptions in FIG. 1. A resonance of the gradient coil system that is excited via a gradient pulse pattern is damped by the subsequent, correspondingly mirrored gradient pulse pattern. The noise remains correspondingly low.

In other embodiments, similarly to FIG. 1, two mirrored gradient pulse patterns are implemented after the first gradient pulse pattern, thereafter two unmirrored gradient pulse patterns, etc., or the same number of gradient pulse patterns does not always occur between the alternation of mirrored and unmirrored gradient pulse patterns.

FIG. 3 shows the diagram of a gradient pulse sequence G, into which additional gradient pulses ZGP are introduced for active damping of excited resonances. The additional gradient pulses have the task of using targeted counter parameters to damp, in the shortest possible time, the excited resonances resulting from the previous gradient pulse pattern GPM. The additional gradient pulses are configured in their form, amplitude and time duration to produce the desired damping effect. Their influence on the process of the magnetic resonance imaging must be taken into account. In an embodiment, the additional gradient pulses serve not only for damping but also assume functions within the process of the magnetic resonance imaging, for example, similar to a spoiler gradient in a spoiled gradient echo pulse sequences.

In another embodiment, the same number of gradient pulse patterns does not always occur between the additional gradient pulses, or the additional gradient pulses vary according to the number of the previous gradient pulse patterns.

In another embodiment it is advantageous to actively damp not only the previously excited resonances with the additional gradient pulses, but rather afterwards to excite the resonances again in such a way that two gradient pulse patterns follow, whereby the first acts to damp and the second to excite again. Thus the frequency of occurrence of the interruptions is halved by the additional gradient pulses in the event of a greater number of additional pulses.

In tube-shaped gradient coil systems, the two gradient coils acting orthogonally to the basic magnetic field and thus, the gradient pulse sequences that control the current in these coils are particularly responsible for producing noise. If a gradient pulse sequence for one of the noise-producing gradient coils causes, for example, a resonant excitation, then damping is possible by means of additional gradient pulses in the other gradient coil. This can occur advantageously in time intervals wherein no impairment of the magnetic resonance imaging is caused.

In other embodiments, combinations of the described, active damping measures are utilized. For reasons of a desired imaging property, it is advantageous, for example, to interrupt a gradient pulse sequence after a gradient pulse pattern for a duration which is a multiple of the reciprocal value of the dominant resonant frequency and to proceed with the mirrored gradient pulse pattern.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for operating a magnetic resonance tomography device having a basic field magnet and a gradient coil system and a control system connected to said gradient coil system for controlling currents in said gradient coil system, comprising the steps of:
   operating said control system to supply currents to said gradient coil system in a gradient pulse sequence and thereby causing excitation of resonant modes of said gradient coil system, at least some of said resonant modes producing noise; and
   generating portions of said gradient pulse sequence in said control system to actively damp said resonant modes which produce noise.

2. A method as claimed in claim 1 wherein said resonant modes which produce noise include a dominant resonant mode having a dominant resonant frequency associated therewith, and comprising operating said control system to produce a gradient pulse sequence consisting of a plurality of repeated patterns of gradient pulses, and interrupting said gradient pulse sequence after respective patterns of gradient pulses for odd-numbered, positive multiples of half of a reciprocal value of said dominant resonant frequency.

3. A method as claimed in claim 1 comprising operating said control system to generate a gradient pulse sequence consisting of a plurality of repeated patterns of gradient pulses, and after generating a predetermined number of patterns of said gradient pulses, mirroring said predetermined number of gradient pulses on a time axis in said gradient pulse sequence.

4. A method as claimed in claim 1 comprising operating said control system to generate a gradient pulse sequence consisting of a plurality of repeated patterns of gradient pulses, and inserting additional gradient pulses between predetermined numbers of said patterns to counteract said resonant modes which produce noise.

* * * * *